United States Patent
Mergen et al.

(10) Patent No.: US 7,211,994 B1
(45) Date of Patent: May 1, 2007

(54) LIGHTNING AND ELECTRO-MAGNETIC PULSE LOCATION AND DETECTION FOR THE DISCOVERY OF LAND LINE LOCATION

(75) Inventors: John-Francis Mergen, Baltimore, MD (US); Carl M. E. Powell, Gaithersburg, MD (US)

(73) Assignee: Federal Network Systems Inc., Arlington, VA (US)

( * ) Notice: Subject to any disclaimer, the term of this patent is extended or adjusted under 35 U.S.C. 154(b) by 102 days.

(21) Appl. No.: 10/963,187

(22) Filed: Oct. 12, 2004

(51) Int. Cl.
*G01R 19/00* (2006.01)
*G01R 31/02* (2006.01)
*G01R 31/28* (2006.01)

(52) U.S. Cl. .......................... 324/66; 324/528; 324/72

(58) Field of Classification Search ................ 324/66, 324/67, 72, 528
See application file for complete search history.

(56) References Cited

U.S. PATENT DOCUMENTS

| | | | | |
|---|---|---|---|---|
| 2,864,081 | A * | 12/1958 | Steelman | 342/460 |
| 3,043,514 | A * | 7/1962 | Smith, Jr. | 701/300 |
| 3,772,594 | A * | 11/1973 | Kuehnast | 324/72 |
| 4,672,305 | A * | 6/1987 | Coleman | 324/72 |
| 5,508,619 | A * | 4/1996 | Ozawa et al. | 324/535 |
| 6,356,082 | B1 * | 3/2002 | Alkire et al. | 324/326 |
| 6,420,862 | B2 * | 7/2002 | Medelius et al. | 324/72 |
| 7,049,937 | B1 * | 5/2006 | Zweig et al. | 340/310.11 |
| 2003/0151397 | A1 * | 8/2003 | Murphy et al. | 324/72 |

OTHER PUBLICATIONS

Weather Data & Links; Lightning Data; http://australiasevereweather.com/links/ozlight.htm; 1 page.
Beneluz/Germany Lightning Detection; http://www.mouse-music.com/boltek/index.php, pp. 1-3.
Newsletter on Atmospheric Electricity, vol. 12, No. 1; http://ae.atmos.uah.edu/AE/ams_2001a.html, pp. 1-19.
VLF Long Range Lightning Detection in Australia, LF EM Research; http://ritz.otago.ac.nz/~sferiz/TOGA_network_Oz_maps.html; 2 pages.
ENERGEX-Community-Lightning Tracker; http://www.energex.com.au/community/lightning_tracker/asp/lightningtracker.asp, 1 page.
Australian Sky & Weather Global Resources; hppt://www.storchasers.au.com/interres.htm, pp. 1-4.
Introduction to Lightning Imaging Sensors (LIS); http://ghrc.msfc.nasa.gov/uso/readme/lis.html; pp. 1-8.
Kattron Lightning Data Service; Australia Wide—In Real Time; http://www.cci.net.au/kattron/datacast.htm; pp. 1-3.

* cited by examiner

*Primary Examiner*—Anjan Deb

(57) ABSTRACT

The identification of the path and termination points of copper landlines is performed through the use of natural events without the aid of network provisioning information. At least one sferics detector detects at least one sferics event. A listening device, which may be separate from, or integrated with, the sferics detector, is attached to at least one wire that is capable of detecting a noise related to the at least one sferics event. A computing device, possibly attached to the listening device, is capable of matching the noise to the at least one sferics event. The computing device is further capable of determining the location of at least part of the wire based on the location of the listening device and locations of at least two sferics events.

20 Claims, 3 Drawing Sheets

US 7,211,994 B1

LIGHTNING AND ELECTRO-MAGNETIC PULSE LOCATION AND DETECTION FOR THE DISCOVERY OF LAND LINE LOCATION

This Invention was made with Government support under contract number MDA904-01-C-0978 awarded by the National Security Agency. The government has certain rights in this Invention.

BACKGROUND OF THE INVENTION

The present invention relates to the identification of the path and termination points of wires such as, for example, telephone lines through the use of natural events such as, for example, lightning strikes, and without use of network provisioning information.

The detection and geo-location of lightning, known as sferics detection, is currently of interest in a number of different areas. Three areas have lead to the development of reasonably priced, reliable and accurate detection and ranging equipment. These are aviation, electric power generation, and severe weather forecasting. The necessary technology has evolved to the point where a number of vendors can provide reliable off-the-shelf lightning detectors of high reliability and accuracy. These vendors include Insight Avionics of Buffalo, N.Y.; Boltek Corporation of Buffalo, N.Y., and Honeywell International, Inc., of Morristown, N.J.

Sferics technology enables the geo-location of lightning strikes through a number of different methods, including the following:

RANGE AND AZIMUTH FROM A SINGLE SITE—Some sferics detectors can produce useful information on the range and azimuth of a strike using phased antennas and pulse shape.

USE OF MULTIPLE SITES AND TIMING—Some systems use a series of highly time-correlated receivers to determine the passing of strike pulses. These systems are analogous to a bobber floating in water detecting ripples by bobbing up and down. A number of bobbers can detect a ripple pattern created when a stone is thrown into the water. The variation on the timing of the arrival of the ripples allows the calculation of the location of the thrown rock. This type of system is a global positioning system (GPS) or long range navigation (LORAN) system run in reverse.

Multiple site and timing systems are quite complex and costly. There is a need for atomic clock level of accuracy at the various locations. Even if GPS timing permits the establishment of add-hoc systems at much lower cost, there is still the need for exchanging information on wave form structure to correlate strike data. However, an advantage of these systems is their range and accuracy. Because of they have long range capability, a regional network is practical, facilitating the gathering information on short notice.

FLASH DETECTION—This is the most straight-forward form of detection. A light flash followed by sound is used to determine the range of the lightning strike. Optical detectors are used to determine the direction of the strike. The problems with this type of geo-location are obvious: limited range, sound detection complexity, complexity in the optical sighting.

DIRECT ORBITAL OBSERVATION—A series of satellites have been lofted to provide detection and tracking of lightning around the globe. Satellites such as the Microlab-1 and other orbital platforms such as the Space Shuttle have carried lightning detection payloads and have produced a wealth of information on strike locations. The occurrence of lightning, satellite location and system availability are the primary limiting factors for this type of data capture.

Existing sferics networks range from the very sophisticated timing-based networks run by national research and meteorological agencies to single-site systems run by private individuals. A large number (several hundred) of these networks makes information directly available on the Internet in a real-time or near real-time basis. The timing resolution ranges from one minute to the range of fifteen to thirty minutes.

Large sferics networks presently exist and are in operation. These sferics networks are used on a regular basis to determine the path and severity of weather information. For example, the United Kingdom's Meteorological Office operates the Arrival Time Difference (ATD) lightning location system. The ATD system is a very sophisticated system which uses multiple sferics detectors and rubidium clock based time coordination to achieve the range and accuracy cited. The ATD system incorporates a number of measurement improvement techniques to reduce false detections and to improve the geo-location capability of the system. A key element of the ATD system is use of a specific receiving station in the network of detectors as the "selector" station. By looking at the waveform recorded at the selector station and comparing this to the waveforms recorded by other stations, it is possible to match the strikes detected. As mentioned earlier, each of the strikes will produce a unique waveform. By matching the wave form patterns, it is then possible to correlate the measures of the various receivers. In addition, it is possible to discard false strike measurements by eliminating indications which were not seen by other sites.

Large national sferics networks such as the ATD system provide substantial continuous coverage over most of the highly populated portions of the world. A number of the national systems provide data in tabular form which can be used to identify specific strike location and timing.

Individual sferics systems often provide data in graphical rather than tabular format with a full screen representation of 50 to 100 miles. Even with fairly sophisticated "screen scraper" technology, the capability to isolate and identify specific strikes is somewhat limited. This problem is exacerbated by the imprecision of lack of a specific address for the detector. (For example, Diekirch, grand Duchy of Luxembourg is one given address. While the entire country is small, identifying the town of Diekirch can mean a location several kilometers on a side.) However, even with these problems, the graphical representations provide a strong reference set for activity estimation and detection probabilities.

In sum, the information stored by existing sferics systems generally provides location, severity and timing of strikes. The long term operational history of several of the detection networks has permitted the calibration and anomaly detection needed to get a high degree of accuracy over the operating field.

Presently the identification of the path and termination of a telephone line can present a tremendous challenge if the network provisioning information is lost or not available. The task of identifying the path can be done by a laborious examination of cable bundles and patch points, but this time and labor-intensive process is not practical over longer distances or in areas having a crowded or dense infrastructure. The time and effort needed to perform this process is often beyond the available resources and capabilities. In addition, the tracing of wire paths often requires the use of two teams (or sets of equipment), one at each end of the wire, i.e., line. The remote-end team must then move down the line. Travel and mobility requirements present logistics, timing and cost challenges, making it difficult if not practically impossible to trace a line. Moreover, the effort to track a specific line must in many cases be duplicated a number of times before a substantial knowledge base is recreated to derive any economies of scale in the tracing of areas' lines. Accordingly, there is a need for an accurate and efficient means of locating wire landlines, and applicants provide a technique based on sferics information that satisfies this need.

BRIEF SUMMARY OF THE INVENTION

The identification of the path and termination points of copper landlines is performed through the use of natural events without the aid of network provisioning information. At least one sferics detector is used for detecting at least one sferics event. A listening device is attached to at least one wire that is capable of detecting a noise related to the at least one sferics event. A computing device, possibly attached to the listening device, is capable of matching the noise to the at least one sferics event. The computing device is further capable of determining the location of at least part of the wire based on the location of the listening device and locations of at least two sferics events.

A method for determining a path of a wire comprises determining locations of at least two sferics events; determining, for each sferics event, a distance of the sferics event from a wire; determining a path of at least a portion of the wire using the locations of the sferics events, the distances of the sferics events from the wire, and a location of an endpoint of the wire. In some embodiments, the sferics event is a lightning strike. In some embodiments, the wire is a copper landline.

DETAILED DESCRIPTION OF THE INVENTION

A novel feature of the present invention is the correlation of two data sets, the first being data relating to lightning strikes using sferics detection systems, and the second being data related to lightning strikes detected over wires. By using sferics detection systems to detect the location of a set of lightning strikes, and by using a time log to determine that the same set of lightning strikes has been detected on a wire, it is possible to identify locations of various points of the wire. Given enough data, it is possible to identify enough points on the wire, including its endpoints, to trace the path of the wire from end to end.

Using personal computers including their modems and sound cards as listening devices or using other listening devices, lightning strikes may be detected over telephone lines. The signal of a lightning strike is in the 10 khz to 30 khz range with substantial amounts of energy concentrated in the less-than-20 khz spectrum. In particular, lightning strikes can be detected over telephone lines in the spectrum below 20 khz, which is within the detectable range of some modems and most sound cards. Sound cards tend to have superior analog-to-digital converters and signal processing capability and thus, when available, are the most attractive means of detecting strikes.

Figure 1:
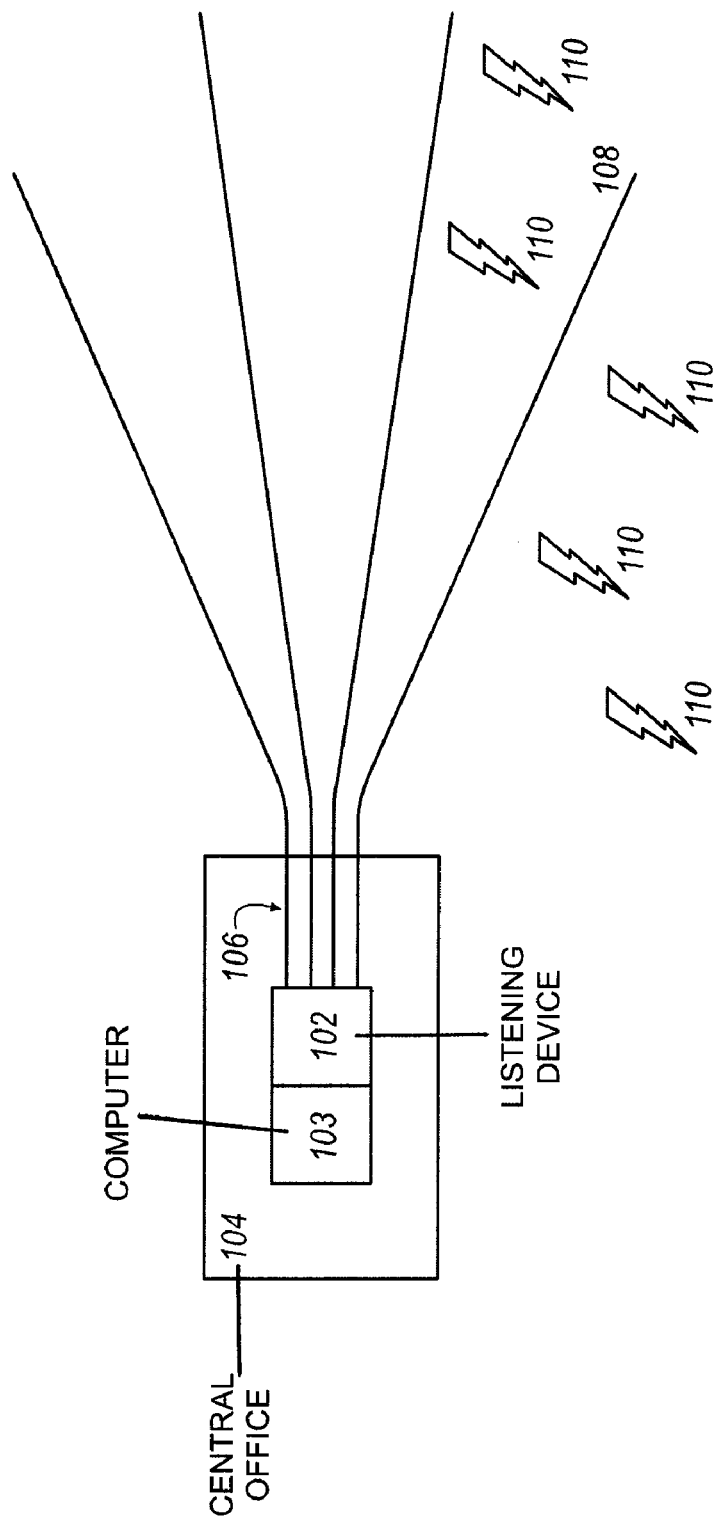
FIG. 1 is an overview of an embodiment of the inventive system.

FIG. 1 shows a listening device 102 attached to a computing device 103 located in a central office 104. Listening device 102 comprises a modem, sound card, or other listening device as might be known to those skilled in the art. In one embodiment, listening device 102 is a microphone capable of detecting the sound of a lightning strike as well as the electro-magnetic pulse (EMP) of a lightning strike. By analyzing the change in the frequency domain of the EMP detected by the microphone at the time of the lightning strike, the distance of the microphone from the strike may be determined. Thus, in this embodiment, listening device 102 is also a sferics detector that can be used to determine the distance of a lightning strike from central office 104.

Computing device 103 may be a personal computer, handheld computer, notebook computer, server computer, or other computing device as might be known to those skilled in the art. Listening device 102 and/or computing device 103 are attached to cable bundle 106, which comprises at least one wire 108. Listening device 102 detects lightning strikes occurring at strike locations 110. Specifically, when a lightning strike occurs at a strike location 110, listening device 102 detects noise on a wire 108, whereupon computing device 103 records the time and frequency of the noise as well as the identity of the wire 108 over which the noise was heard. In some embodiments wire 108 is a copper, land-based telephone line.

Figure 2:
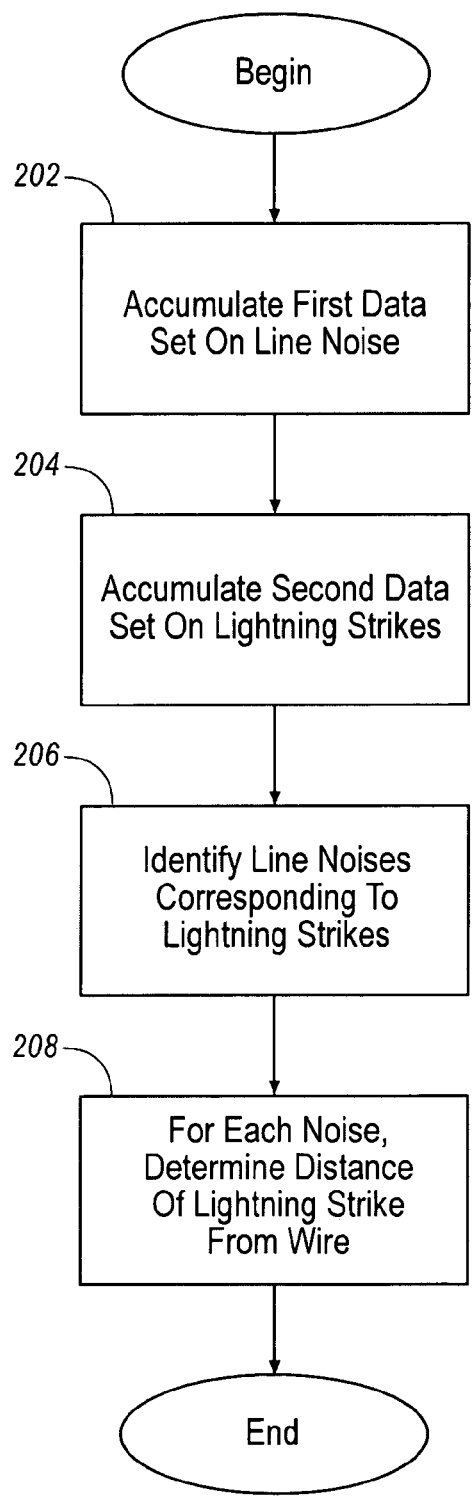
FIG. 2 describes the process flow used by the invention to locate wires using sferics events, according to an embodiment.

FIG. 2 depicts the process flow of an embodiment of the inventive system. In general the described process is implemented on software running on computing device 103, although those skilled in the art will understand that data collected on computing device 103 and elsewhere could be transferred to one or more computing devices for the analysis described herein. Also, those skilled in the art will recognize that all of the steps described herein could be carried out completely or partially manually. For example, in some embodiments, data is entered or imported into an electronic spreadsheet such as MICROSOFT EXCEL®, made by Microsoft Corporation of Redmond, Wash., in order to conduct the analysis described herein. Moreover, the software process may be custom-coded or may utilize an off-the-shelf software product such as MICOSOFT EXCEL or MATLAB® made by The Mathworks, Inc. of Natick, Mass. For example, program steps may be implemented in MICROSOFT VISUAL BASIC® for applications, or in the MATLAB programming environment. Other embodiments use the C/C++ programming language to implement the program steps described herein.

In block 202, the process accumulates a first data set comprising the times and frequencies, in kilohertz, of noises recorded on a wire 108.

In block 204, the process is provided with a second data set comprising sferics data accumulated within a range of times corresponding to the range of times in which the first data set was collected. Those skilled in the art will understand that the second data set may comprise sferics data accumulated from a variety of sferics monitoring sites and/or networks. Sferics data from any location may be included in the second data set, but those of ordinary skill in the art will recognize that data related to lightning strikes at strike locations 110 that are within a certain proximity to wire 108 is more likely to be useful. In practice, it has been determined that lightning strikes up to seven miles away from a wire 108 can be used to determine a point on the wire 108 to a precision of within a few hundred feet.

In block 206, the process compares the first data set with the second data set to determine which of the recorded noises in the first data set likely correspond to lightning strikes recorded in the second data set. The basis for this determination is a match between the time a noise was recorded on wire 108 and the time of a lightning strike.

In block 208, for each noise matched to a lightning strike in block 206, the process determines the distance $D_w$ from the point on wire 108 that is closest to lightning strike location 110. Those skilled in the art will recognize that there are a number of ways in which this determination could be made. In one embodiment, the distance of wire 108 from a lightning strike location 110 is determined by analyzing the pulse shape of the signal, i.e., noise, detected on wire 108. The determination of a distance based on analysis of pulse shape will be well known to those skilled in the art of sferics detection.

Figure 3A:
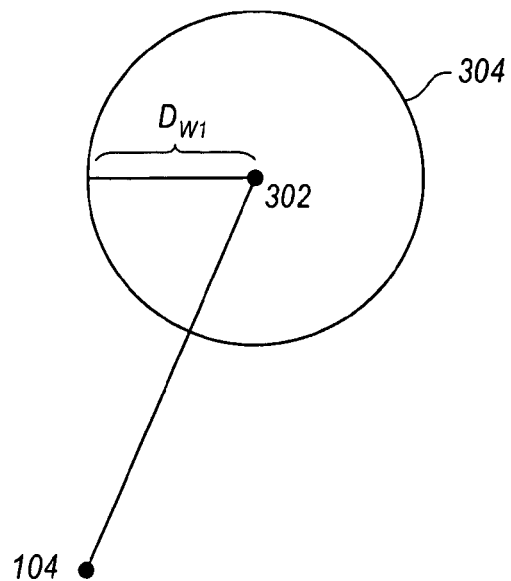
FIGS. 3A and 3B are diagrams illustrating the analysis used by the present invention to locate wires using sferics events, according to an embodiment.

By performing the process of block 208 at least once, it is possible to obtain useful information, namely the distance $D_w$ from the point on wire 108 that is closest to a particular lightning strike location 110. The process of block 208 should be performed two or more times (i.e., each additional time corresponding to a new lightning strike) in order to determine the location of a point on wire 108. The reason for this is illustrated in FIG. 3. Turning first to FIG. 3A, point 302 represents the strike location 110 of a single lightning strike. Point 302 is at the center of circle 304, whose radius is the distance $D_{w1}$ from wire 108, determined as discussed with reference to block 208. Thus, given data from only one lightning strike, the most that can be determined regarding the location of wire 108 is that some point on the circumference of circle 304 is also a point on wire 108. In other words, wire 108 is tangent to circle 304, but at an undetermined point on the circle.

Figure 3B:
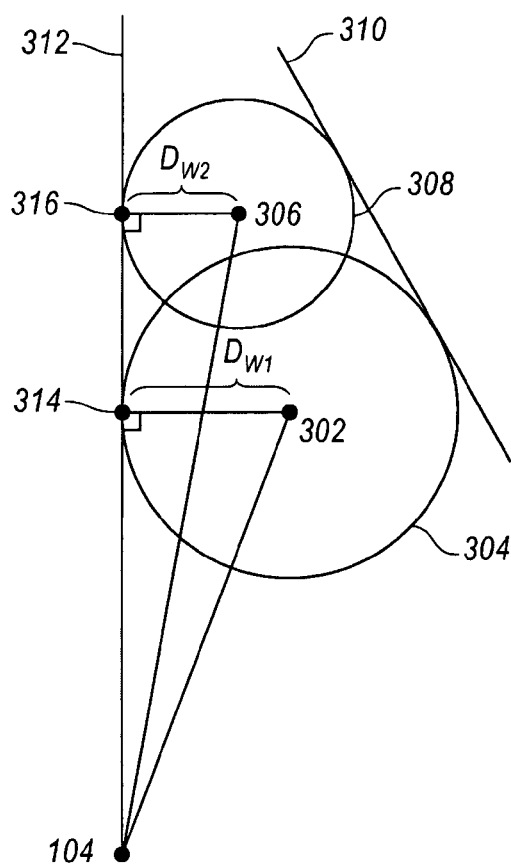

FIG. 3B illustrates the use of two lightning strikes to determine points on wire 108. In addition to point 302, representing the location of a first lightning strike, point 306 represents the location of a second lightning strike, and distance $D_{w2}$, the radius of circle 308, represents the shortest distance of point 306 from wire 108. Thus, FIG. 3B illustrates two circles 304 and 308 and on the circumference of each circle lies a point that also lies on wire 108. In other words, wire 108 is tangent to both circles 304 and 308. Drawing from the geometric axiom that only two lines are tangent to any two given intersecting circles, it is apparent that either line 310 or line 312 should pass through two points on wire 108. With reference to FIG. 3B, inasmuch as the location of central office 104 is known, it follows that points 314 and 316 on line 312, which passes through a point representing central office 104, should represent a location, or path, of wire 108. Of course, in practice wire 108 will rarely be, or even approximate, a straight line, and thus generally many more than two lightning strikes are preferable to trace the path of wire 108. As will be recognized by one skilled in the art, using a greater number of data points in tracing the path of wire 108 will result in a lower rate of error in determining that path.

The above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the field of identifying the path and termination points of wires through the use of natural events, and that systems and methods will be incorporated into such future embodiments. Accordingly, it will be understood that the invention is capable of modification and variation and is limited only by the following claims.

What is claimed as new and desired to be protected by Letters Patent of the United States is:

1. A system for determining the location of a wire, comprising:
   a listening device attached to at least one wire that is capable of detecting a noise related to at least one detected sferics event; and
   a computing device capable of matching the noise to the at least one sferics event and of determining a distance of the at least one wire from the at least one sferics event.

2. The system of claim 1, wherein the at least one detected sferics event is detected by a plurality of sferics detectors.

3. The system of claim 2, wherein the computing device is further capable of determining a location of at least part of the at least one wire based on the location of the listening device and locations of at least two sferics events.

4. The system of claim 2, wherein the computing device is further capable of determining a path of the at least one wire based on the location of the listening device and locations of a plurality of sferics events.

5. The system of claim 1, wherein the sferics event is a lightning strike.

6. The system of claim 1, wherein the computing device is attached to the listening device.

7. The system of claim 6, wherein the listening device is a modem.

8. The system of claim 6, wherein the listening device is a sound card.

9. The system of claim 6, wherein the listening device is a microphone.

10. A method for determining the location of a wire, comprising:
    detecting at least one sferics event;
    detecting a noise on the wire related to the at least one sferics event;
    matching the noise to the at least one sferics event; and
    determining a distance of the wire from the at least one sferics event; and
    locating the wire based on the distance.

11. The method of claim 10, wherein the noise is detected by a listening device.

12. The method of claim 11, further comprising determining a location of at least part of the wire based on the location of the listening device and locations of at least two sferics events.

13. The method of claim 11, further comprising determining a path of the wire based on the location of the listening device and locations of a plurality of sferics events.

14. The method of claim 11, wherein a computing device is attached to the listening device.

15. The method of claim 14, wherein the listening device is a modem.

16. The method of claim 14, wherein the listening device is a sound card.

17. The method of claim 11, wherein the sferics event is a lightning strike.

18. A method for determining a path of a wire, comprising:
   determining locations of at least two sferics events;
   determining, for each sferics event, a distance of the sferics event from a wire; and
   determining a path of at least a portion of the wire using the locations of the sferics events, the respective distances of the sferics events from the wire, and a location of an endpoint of the wire.

19. The method of claim 18, wherein the sferics event is a lightning strike.

20. The method of claim 18, wherein the wire is a copper landline.

* * * * *